United States Patent
Chen et al.

(10) Patent No.: US 12,394,647 B2
(45) Date of Patent: Aug. 19, 2025

(54) WAFER SHIFT DETECTION

(71) Applicant: Taiwan Semiconductor Manufacturing Company, Hsinchu (TW)

(72) Inventors: Ming-Sze Chen, Hsinchu (TW); Yuan-Hsin Chi, Taichung (TW); Hung-Chih Wang, Taichung (TW); Sheng-Yuan Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 276 days.

(21) Appl. No.: 18/093,085

(22) Filed: Jan. 4, 2023

(65) Prior Publication Data

US 2024/0105480 A1   Mar. 28, 2024

Related U.S. Application Data

(60) Provisional application No. 63/409,355, filed on Sep. 23, 2022.

(51) Int. Cl.
*H01L 21/67* (2006.01)
*H01L 21/673* (2006.01)
*H01L 21/677* (2006.01)

(52) U.S. Cl.
CPC .. *H01L 21/67265* (2013.01); *H01L 21/67326* (2013.01); *H01L 21/67751* (2013.01)

(58) Field of Classification Search
CPC ......... H01L 21/67265; H01L 21/67326; H01L 21/67751; H01L 21/67259
See application file for complete search history.

(56) References Cited

U.S. PATENT DOCUMENTS

| | | | | |
|---|---|---|---|---|
| 5,225,691 A | * | 7/1993 | Powers | H01L 21/67265 250/559.4 |
| 5,933,521 A | * | 8/1999 | Pasic | H01L 21/67294 382/145 |
| 6,303,939 B1 | * | 10/2001 | Chung | H01L 21/67265 414/935 |

(Continued)

FOREIGN PATENT DOCUMENTS

| CN | 203941380 U | * | 11/2014 | ............. G01N 21/01 |
|---|---|---|---|---|
| CN | 117347377 A | * | 1/2024 | ............. G01N 21/01 |

(Continued)

*Primary Examiner* — Mohammed Shamsuzzaman
(74) *Attorney, Agent, or Firm* — Lippes Mathias LLP

(57) ABSTRACT

A wafer storage elevator and method for detecting wafer position shift. The elevator includes a first storage elevator sidewall, a second storage elevator sidewall, and a storage seat positioned between the first and second storage elevator sidewalls. A first mirror block is coupled to a front side of the storage seat having a mirror positioned on a top surface of the block, and a second mirror block is coupled to the front side of the storage seat having a mirror that is positioned on the top surface of the second mirror block. The mirror of the first mirror block reflects a laser beam from an emission sensor to the second mirror block, and the mirror of the second mirror block reflects the laser beam from the mirror of the first mirror block to a receive sensor. A wafer misalignment is determined based upon an output of the receive sensor.

19 Claims, 15 Drawing Sheets

(56) References Cited

U.S. PATENT DOCUMENTS

| | | | | |
|---|---|---|---|---|
| 7,663,129 B1* | 2/2010 | Lu | ................... | H01L 21/67265 |
| | | | | 250/559.19 |
| 9,202,732 B2* | 12/2015 | Enomoto | .......... | H01L 21/67265 |
| 9,239,228 B2* | 1/2016 | Natsume | ........... | H01L 21/67265 |
| 10,092,929 B2* | 10/2018 | Bonora | ................ | B25J 15/0028 |
| 11,469,123 B2* | 10/2022 | Bergantz | ........... | H01L 21/67265 |
| 11,996,308 B2* | 5/2024 | Tseng | ....................... | G01V 8/12 |
| 2002/0021959 A1* | 2/2002 | Schauer | ............ | H01L 21/67259 |
| | | | | 414/744.2 |
| 2003/0119214 A1* | 6/2003 | Kitazawa | .......... | H01L 21/67265 |
| | | | | 438/5 |
| 2004/0086171 A1* | 5/2004 | Jun | ................... | H01L 21/67253 |
| | | | | 382/149 |
| 2012/0101633 A1* | 4/2012 | Rodnick | ........... | H01L 21/67259 |
| | | | | 700/253 |
| 2020/0285156 A1* | 9/2020 | Kiyotomi | ............ | H01L 21/6715 |
| 2021/0407831 A1* | 12/2021 | Sunugatov | ................ | G06T 7/13 |
| 2022/0399219 A1* | 12/2022 | Wu | ....................... | H01L 21/681 |
| 2023/0197480 A1* | 6/2023 | Kiyotomi | ............... | G06V 10/98 |
| | | | | 118/713 |
| 2023/0274971 A1* | 8/2023 | Masuda | ................ | H01L 21/677 |
| | | | | 438/464 |

FOREIGN PATENT DOCUMENTS

| | | | | | |
|---|---|---|---|---|---|
| EP | 1047115 A2 | * | 10/2000 | ............. | B23Q 17/24 |
| JP | 2000077490 A | * | 3/2000 | ....... | H01L 21/67259 |
| JP | 2005005608 A | * | 1/2005 | ....... | H01L 21/67259 |
| JP | 2022157983 A | * | 10/2022 | ....... | H01L 21/67259 |
| WO | WO-0022589 A1 | * | 4/2000 | ....... | H01L 21/67265 |
| WO | WO-2008154764 A1 | * | 12/2008 | ....... | H01L 21/67259 |

* cited by examiner

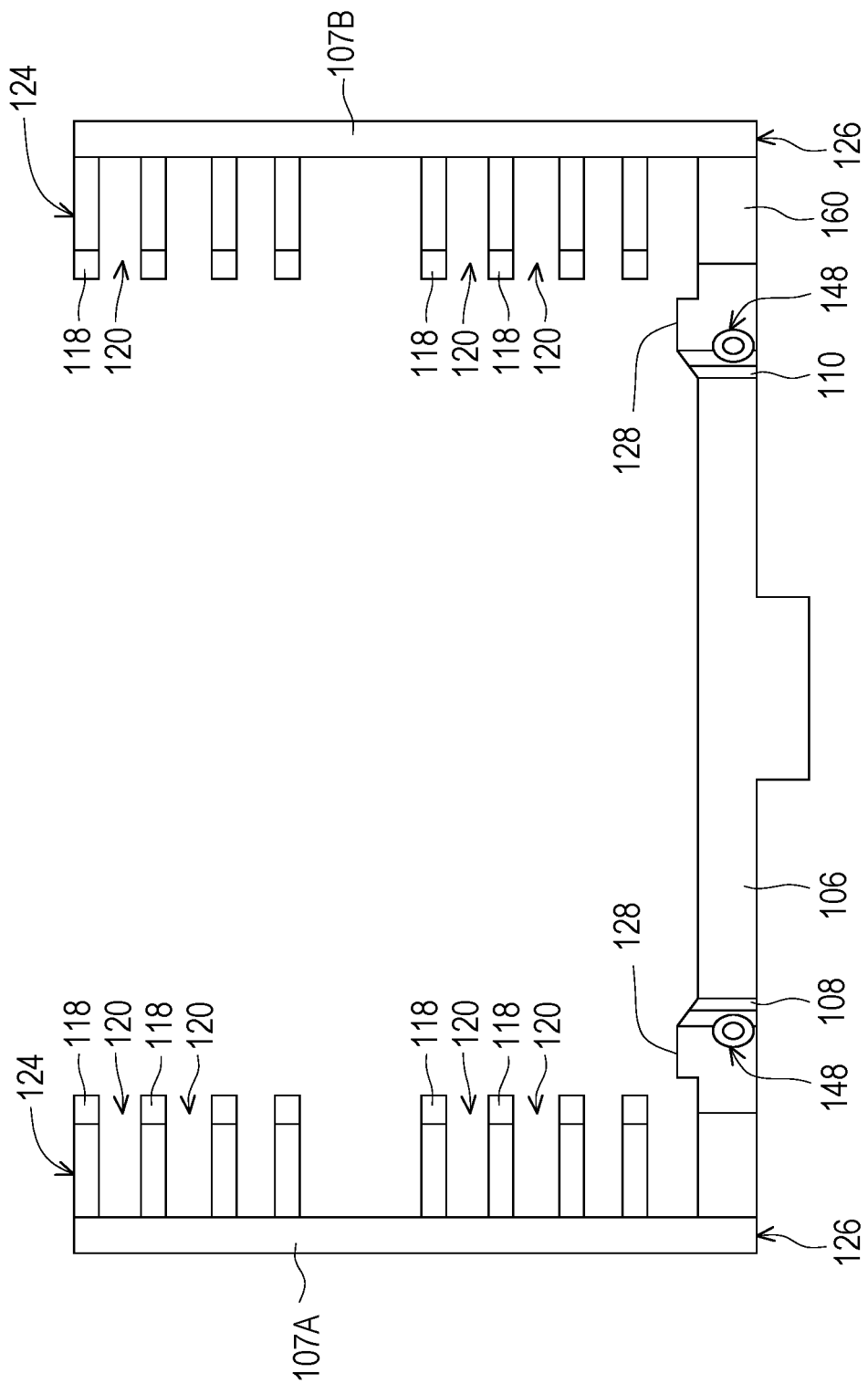

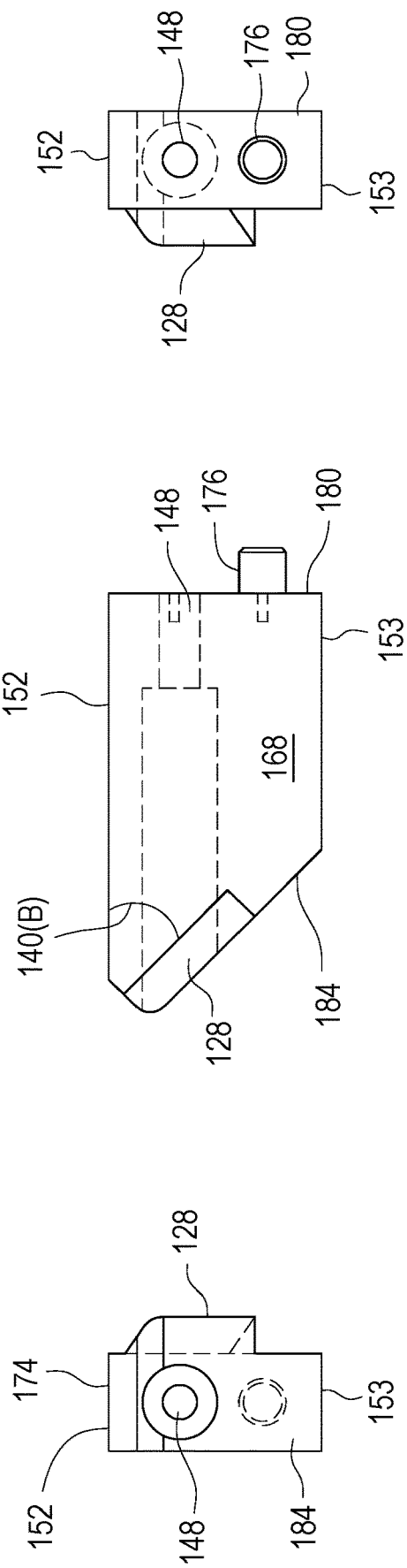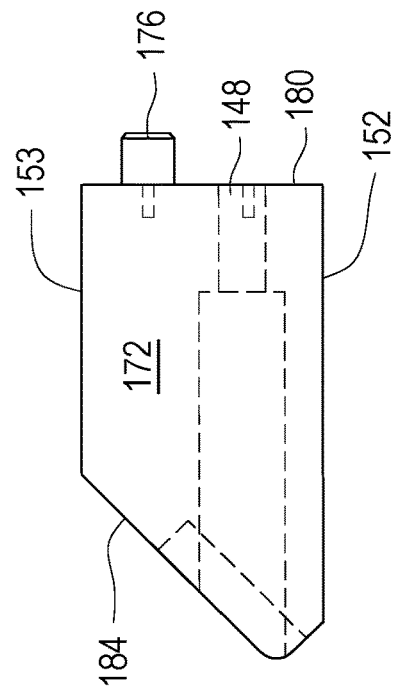
FIG. 6D
FIG. 6A
FIG. 6B
FIG. 6C

WAFER SHIFT DETECTION

PRIORITY CLAIM AND CROSS-REFERENCE

This application claims the benefit of U.S. Provisional Application Ser. No. 63/409,355 filed Sep. 23, 2022, and titled WAFER SHIFT DETECTION which is incorporated herein by reference in its entirety.

BACKGROUND

Semiconductor wafers are often stored and processed in a wafer cassette of some type. The wafers are normally facing in one direction so that the device side of each wafer in the interior of the stack faces the backside of the adjacent wafer. Prior to processing, wafers are stored in storage elevators within a buffer chamber. Wafers are loaded into the storage elevator from carriers and transit from the buffer chamber to a process chamber via robotic arms. Wafers should be properly aligned within the buffer chamber for the robotic arm to retrieve to prevent damage to the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a front view of a storage elevator in accordance with some embodiments.

FIGS. 6A-6E are views of a second mirror block in accordance with some embodiments.

DETAILED DESCRIPTION

Figure 1:
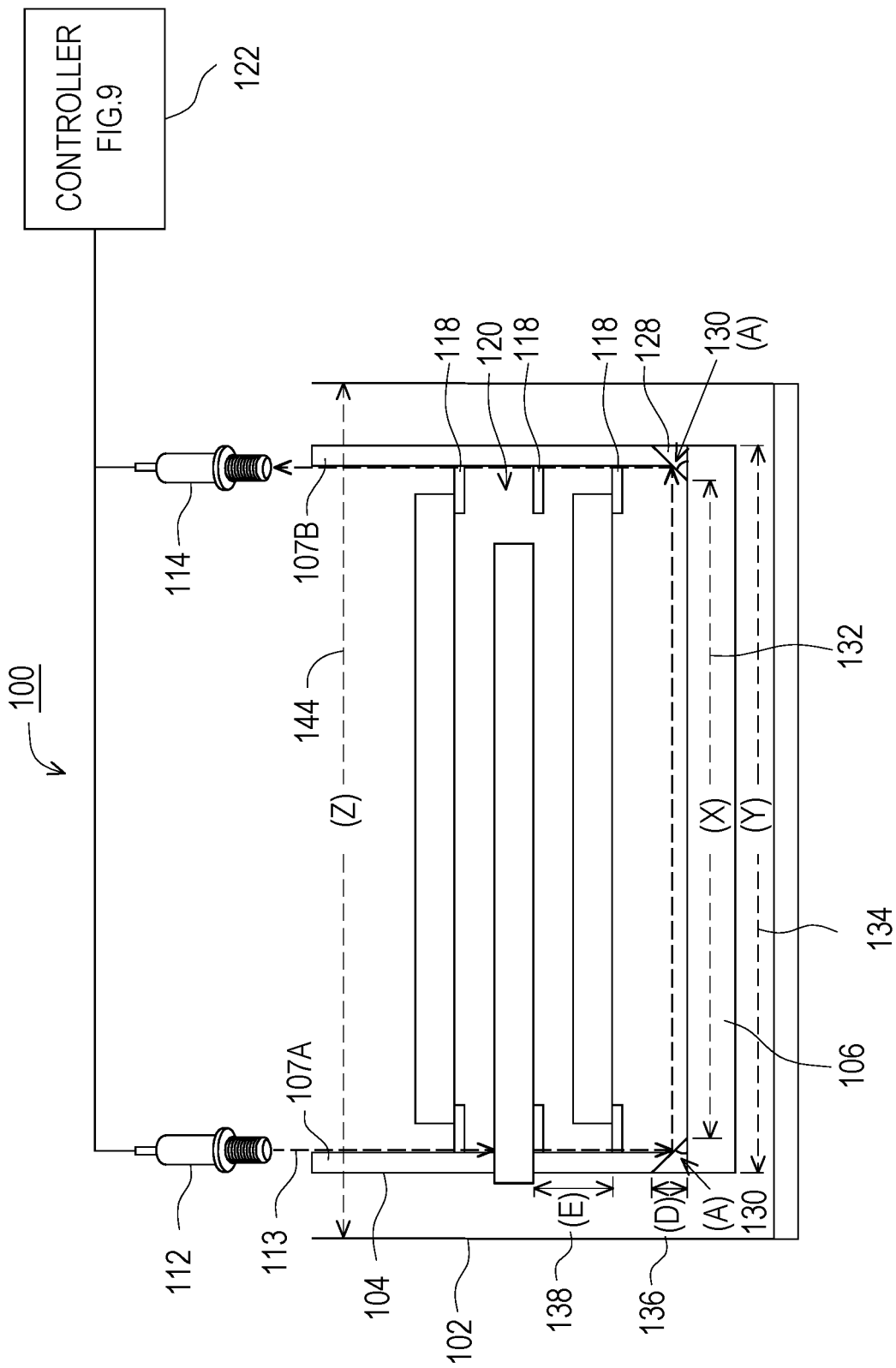
FIG. 1 is a simplified view of a wafer storage system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Referring now to FIG. 1, there is shown a wafer position shift detection system 100 in accordance with some embodiments. As illustrated in FIG. 1, the wafer position shift detection system 100 utilizes a storage elevator 104 disposed within a buffer chamber 102 of a semiconductor manufacturing apparatus (illustrated as the exemplary semiconductor manufacturing system 800 of FIG. 8, discussed in greater detail below). It will be appreciated that the buffer chamber 102 may correspond to a wafer transfer chamber, wherein a robot unit (not shown) transfers wafers from a cassette to a storage elevator 104 of process chamber. The storage elevator 104 may be implemented as a wafer transfer position, before processing starts and after processing ends, as discussed below. In accordance with one embodiment, the storage elevator 104 includes a storage elevator seat 106 fixed at a bottom of the storage elevator 104, a first elevator sidewall 107A and a second elevator sidewall 107B. As shown in FIG. 1, the first elevator sidewall 107A and the second elevator side wall 107B are positioned on opposite edges of the storage elevator seat 106 and extend perpendicularly upward from the storage elevator seat 106. In some embodiments the first and second elevator sidewalls 107A and 107B are mutually parallel.

In some embodiments, the first and second elevator sidewalls 107A-107B are removably coupled to the storage elevator seat 106. Suitable attachment mechanisms include, for example and without limitation, screws, nut/bolt, interlocking tabs/slots, or the like. The wafer shift detection system 100 further utilizes a first mirror block 108 and a second mirror block 110 affixed to the storage elevator seat 106, as illustrated in FIGS. 2A-4 and discussed in greater detail below. A more detailed view of the first mirror block 108 and the second mirror block 110 are shown in FIGS. 5A-7B, discussed below. In some embodiments, the mirror blocks 108, 110 may be fabricated (e.g., integrated molding, casting, milling, etc.) of a suitable materials, e.g., aluminum, aluminum alloy, metal alloy, high density plastic, or the like. Positioned above the first mirror block 108 is at least one emission source, i.e., laser 112 configured to emit light, e.g., a laser beam 113, down to the first mirror block 108. The laser 112 may, by way of nonlimiting illustrative example, comprise a helium neon (HeNe) laser, or a semiconductor laser diode or light emitting diode (LED), optionally with collimating refractive and/or reflective optics (e.g., a collimating lens). In accordance with one embodiment, the laser 112 and sensor 114 are implemented as through beam sensors, i.e., a pair of components, with one laser 112 dedicated to transmit the laser beam 113 and one sensor 114 dedicated to receive the laser beam 113, resulting in more accurate detection than a diffused sensor setup (i.e., single sensor functioning to send and receive). The first mirror block 108, as indicated in FIG. 1, directs the light across the storage elevator seat 106 to the second mirror block 110. Thereafter, the second mirror block 110 directs the light to a receive sensor 114 position above the second mirror block 110. Accordingly, any wafer 116A-116C out of alignment within the storage elevator 104 will interrupt or block transmission of the laser beam 113 from the laser 112 to the receive sensor 114. Thus, the laser beam 113 transits an optical path from the emission source or laser 112, down the first sidewall 107A to the first mirror 128 of the first mirror block 108, across the seat 106 to the second mirror 128 of the second mirror block 110, and up the second sidewall 107B to the receive sensor 114. A more detailed view of the storage elevator seat 106 is provided below with respect to FIG. 4.

The storage elevator 104 further includes one or more storage elevator wafer rails 118 positioned on the interior sides of each of the first elevator sidewall 107A and second elevator sidewall 107B, thereby defining a wafer slot 120 configured to hold a wafer therein. FIG. 1 illustrates the presence of one or more wafers 116A, 116B, and 116C positioned in slots 120 of the storage elevator 104. It will be appreciated that the storage elevator 104 may be configured to store any number of wafers 116A-116C, and the illustration of three wafers 116A-116C is intended solely to illustrate certain aspects of the present embodiment. As shown in FIG. 1, wafers 116A and 116C are in proper position within the storage elevator 104, whereas wafer 116B is illustrated as being out of alignment. In some embodiments, detection of the out-of-position or out of alignment of the wafer 116B is determined in accordance with the output of the sensor 114, as discussed in greater detail below. In such embodiments, the emission source or laser 112 and the receive sensor 114 are in data communication with a controller 122, the functioning of which is discussed in greater detail below with respect to FIG. 9.

Figure 2B:
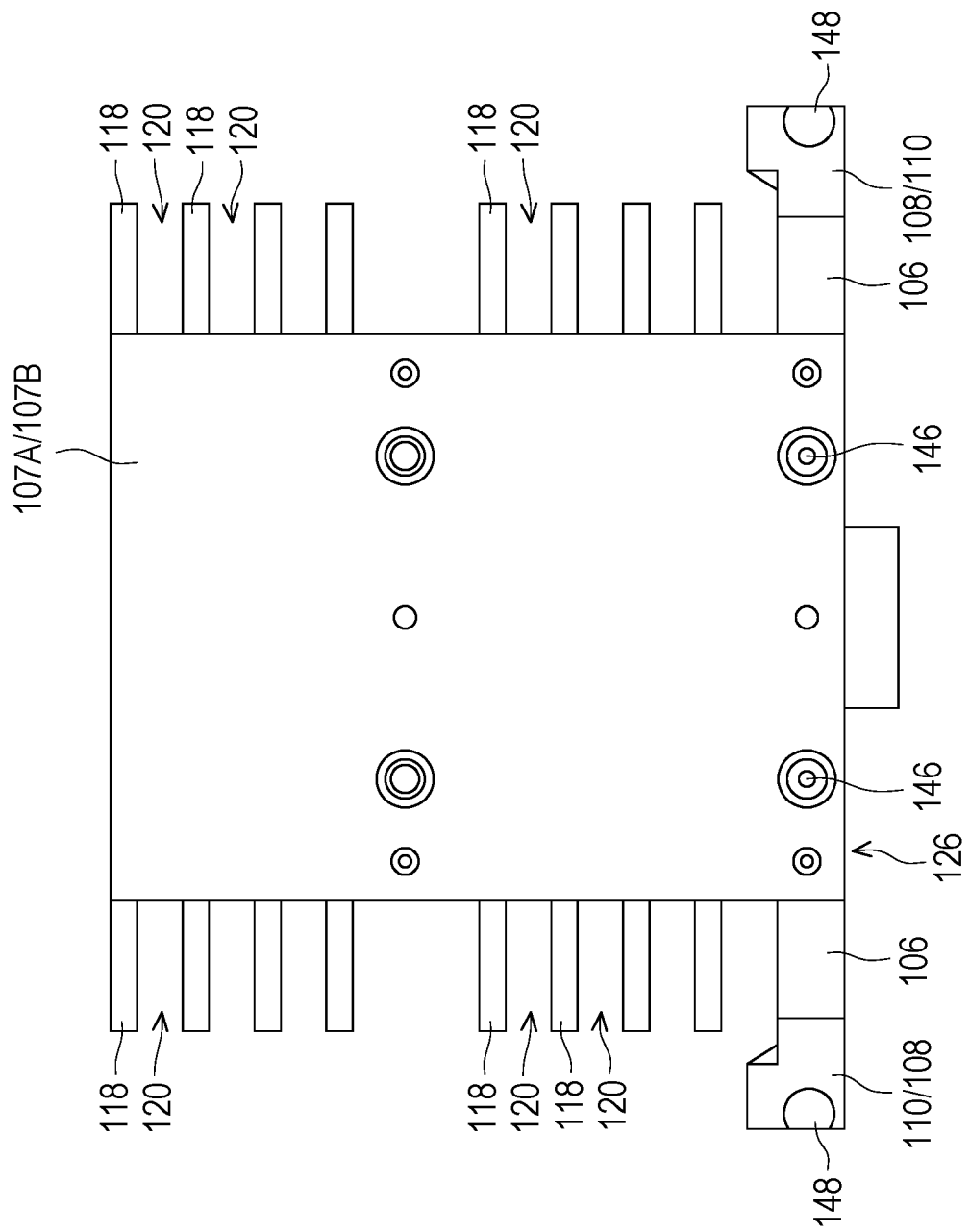
FIG. 2B is a side view of the storage elevator of FIG. 2A.

Turning now to FIGS. 2A and 2B, there are shown, respectively, a front view and a side view of the storage elevator 104 in accordance with some embodiments. As shown in FIG. 2A, the storage elevator 104 includes a plurality of storage elevator wafer rails 118 located on the inner side (extending inward towards each other) of the first elevator sidewall 107A and the second elevator sidewall 107B to form a plurality of storage elevator slots 120. The storage elevator wafer rails 118, as shown in FIG. 2B, extend perpendicularly across the respective elevator sidewalls 107A-107B and extend laterally outward therefrom.

The storage elevator seat 106, in accordance with some embodiments, is illustrated in FIGS. 2A-2B with the aforementioned first and second mirror blocks 108-110 affixed thereto. As shown in FIG. 2B, each side of the storage elevator seat 106 includes a pair of mirror blocks, i.e., one first mirror block 108 and one second mirror block 110. In some embodiments, a pair of emission sources or lasers 112 and a corresponding pair of receive sensors 114 are utilized in the wafer position system 100, e.g., positioned to interact with corresponding pairs of first and second mirror blocks 108, 110. It will be appreciated that, as depicted in FIG. 2B, each of the mirror blocks 108-110 extends laterally and in parallel with the storage elevator wafer rails 118. In accordance with some embodiments, each mirror block 108-110 extends past the end of the storage elevator wafer rails 118, as illustrated in FIG. 2B. FIG. 2B further illustrates the attachment of the storage elevator seat 106 to the storage elevator sidewalls 107A-107B. Further illustrated in FIG. 2B are attachment points 146 located on the bottom of the sidewalls 107A-107B for use in coupling the storage elevator seat 106 to the sidewalls 107A-107B. In some embodiments, a screw, bolt, friction, etc., fastener (not shown) is inserted through the attachment points 146 so as to secure the storage elevator seat 106 to the bottom 126 of the sidewalls 107A-107B.

Figure 2C:
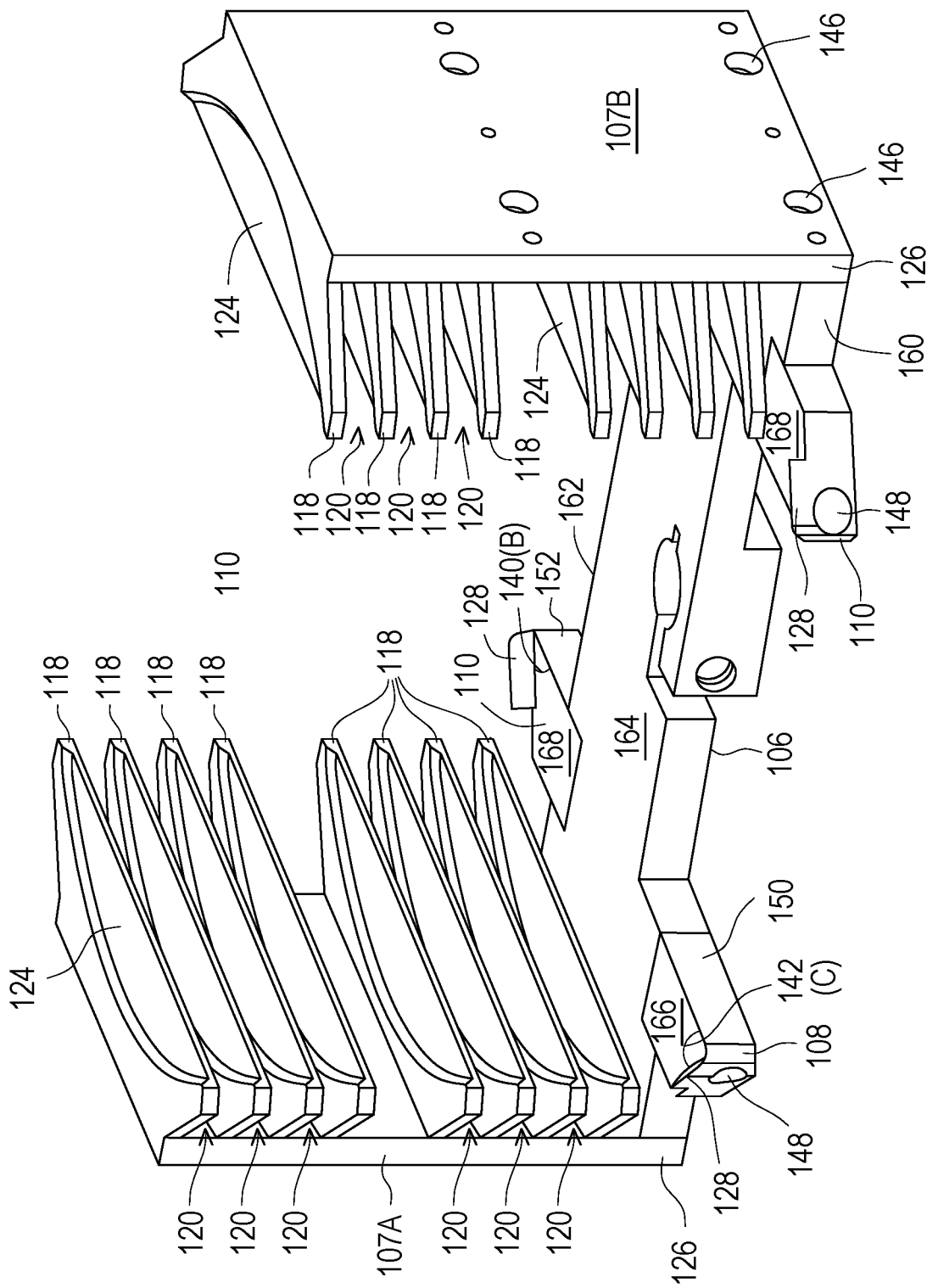
FIG. 2C is a three-dimensional view of the storage elevator of FIGS. 2A-2B.

FIG. 2C provides a three-dimensional view of the wafer storage elevator 104 of FIGS. 2A-2B. As shown in FIG. 2C, each of the wafer storage elevator rails 118 includes a corresponding semi-circular indentation 124 configured to hold a wafer 116A-116C within the storage elevator 104. It will be appreciated that the radius of the semi-circular indentation 124 is dependent upon the size of the wafer 116A-116C being processed. For example, a six-inch (i.e., 150 mm) diameter wafer will have a smaller semi-circular indentation 124 than an eight-inch (i.e., 200 mm) diameter wafer. Similarly, the radius of the semi-circular indentation 124 for an eight-inch (i.e., 200 mm) diameter wafer will be smaller than the radius of a semi-circular indentation 124 for a twelve-inch (i.e., 300 mm) wafer.

Figure 3:
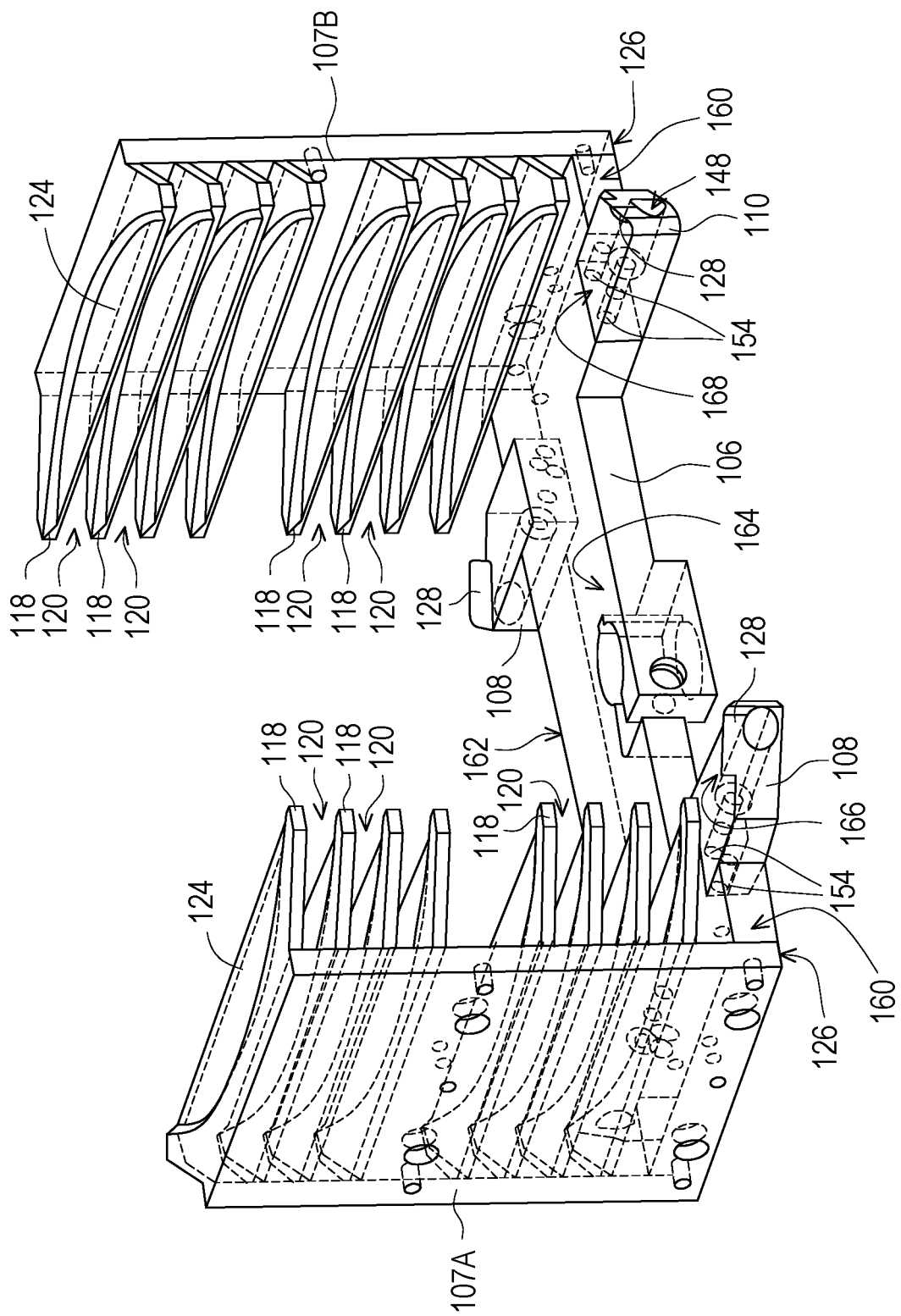
FIG. 3 is an isometric view of the storage elevator of FIGS. 2A-2C.

Further illustrated in FIG. 2C are three of the four mirror blocks 108-110 coupled to the storage elevator seat 106. Each of the mirror blocks 108-110 further includes an attachment point 148 for use in securing the mirror blocks 108-110 to the storage elevator seat 106. As illustrated in FIG. 2C, the attachment points 148 correspond to a hole extending laterally through the corresponding mirror block 108-110 into which a fastener may be inserted to secure the mirror block 108-110 to the storage elevator seat 106. In some embodiments, a screw, bolt, friction, etc., fastener (not shown) is inserted through the attachment points 148 so as to secure the mirror blocks 108-110 to the storage elevator seat 106. FIG. 3 provides an isometric view of the storage elevator 104 in accordance with the embodiments set forth in FIGS. 2A-2C.

With reference now to FIGS. 1-3, various relationships between dimensions are discussed in accordance with one exemplary embodiment. As shown in FIGS. 1-3, each mirror 128 positioned on the mirror blocks 108, 110 includes a mirror angle (A) 130, i.e., upward reflective surface angle. In accordance with one example embodiment, each mirror 128 has the same mirror angle (A) 130, e.g., 45 degrees. The skilled artisan will appreciate that other complementary angles may be used so as to direct the laser beam 113 emitted from the laser 112 as shown in FIG. 1. It will further be appreciated that the mirror angle (A) 130 may depend upon the angle of the emission source or laser 112 and the receive sensor 114. Accordingly, for example, the mirrors 128 of the first mirror blocks 108 may be implemented as the same angle and the mirrors 128 of the second mirror blocks 110 may be implemented as the same angle that is different from the angle of first mirror blocks 108. The mirrors 128 may be constructed of any suitable reflective material, including, for example and without limitation, aluminum, silver alloy, aluminum alloy, metal-alloy, etc.

As illustrated in FIG. 2C, the mirror 128 positioned on the first mirror block 108 has an angle (C) 142 relative to the first mirror block first edge 150, and the mirror 128 positioned on the second mirror block 110 has an angle (B) 140 relative to the second mirror block first edge 152. In accordance with some embodiments, the angle (C) 142 and the angle (B) 140 of the mirror blocks 108, 110 are equal. The skilled artisan will appreciate that variations in degrees of the angles (B) and (C) 140-142 are capable of being implemented in other embodiments in accordance with different positioning of the laser 112 and sensor 114 so as to ensure that the laser beam 113 transmitted by the emission source or laser 112 transits as shown in FIG. 1 down the first storage elevator sidewall 107A, across the storage elevator seat 106 and up the second storage elevator sidewall 107B to the receive sensor 114. Accordingly, a wafer 116B out of alignment will block receipt of the laser beam 113 by the receive sensor 114.

As illustrated in FIG. 1, each storage elevator slot 120 defined between two vertical storage elevator wafer slot rails 118 may be implemented with a height (E) 138 of a predetermined size. The height (D) 136 of each mirror 128 may be implemented as less than one half the height (E) 138 of the storage elevator slot 120. In other embodiments, the height (D) 136 of each mirror 128 may be implemented in a range of ⅓ to ½ the height (E) 138 of the storage elevator slot 120. Further, distance (Y) 134 between the highest edge of the mirrors 128 may be implemented as less than the edge-to-edge distance (Z) 144 of the buffer chamber 102. Similarly, the distance (X) 132 between the lowest edge of the mirrors 128 may be implemented as greater than the diameter of the wafer 116A-116C, i.e., for an eight-inch (200 mm) wafer, the distance (X) 132 may be greater than eight inches (200 mm).

Figure 4:
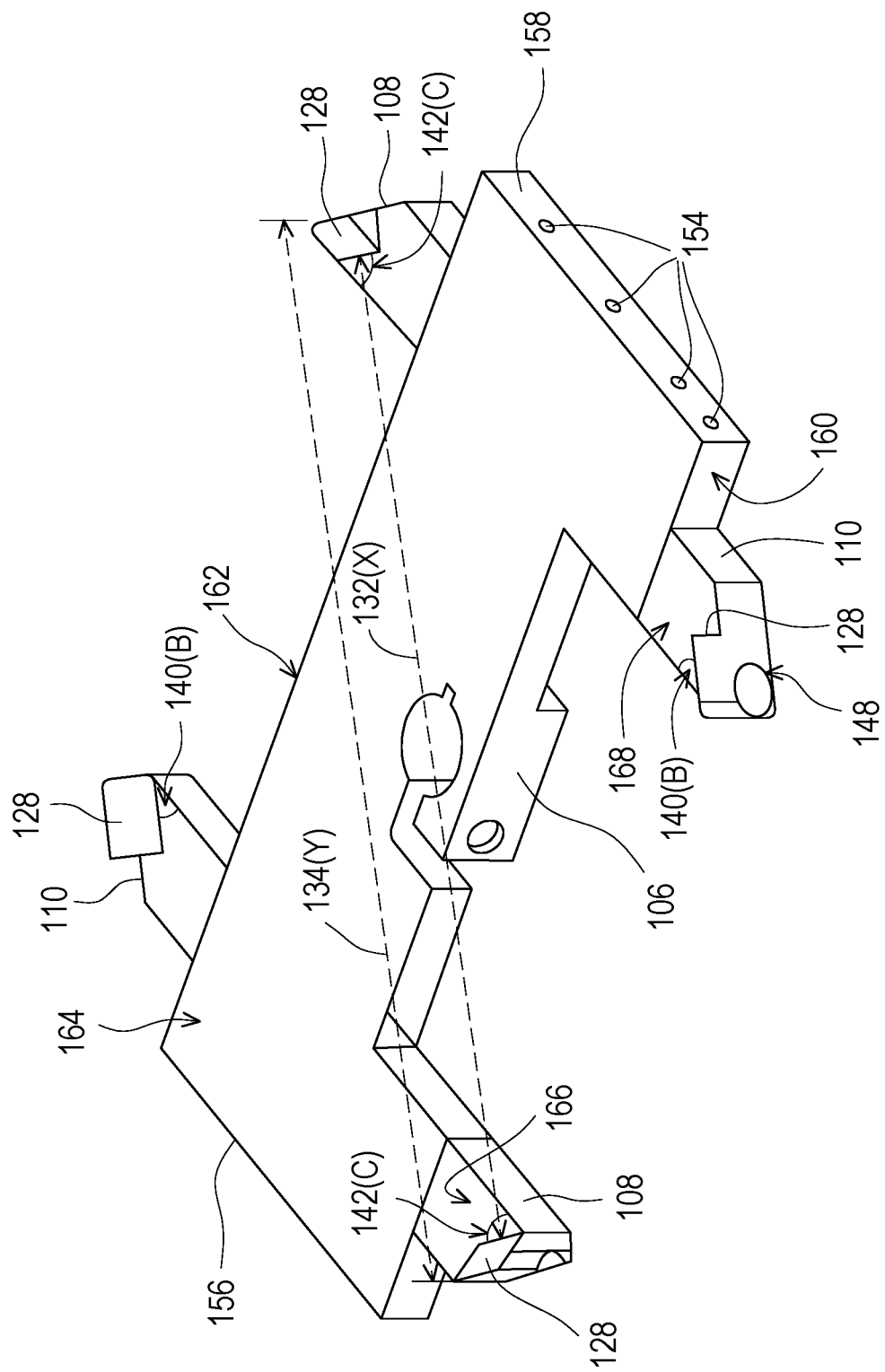
FIG. 4 is a three-dimensional view of a storage elevator seat in accordance with some embodiments.
Figure 5C:
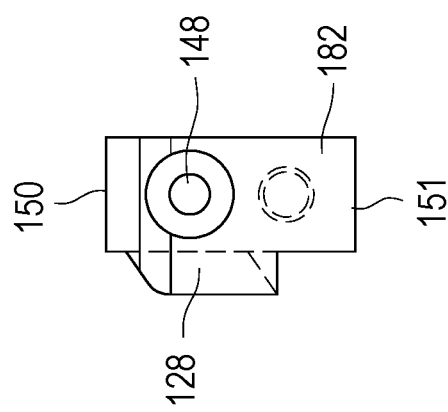
FIGS. 5A-5E are views of a first mirror block in accordance with some embodiments.
Figure 5A:
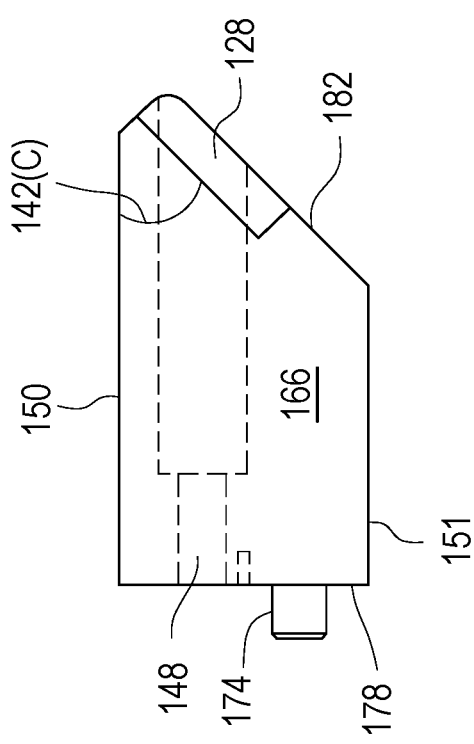
Figure 5B:
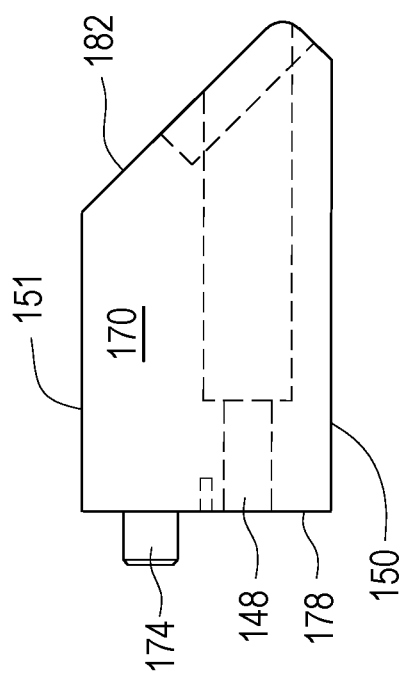
Figure 5D:
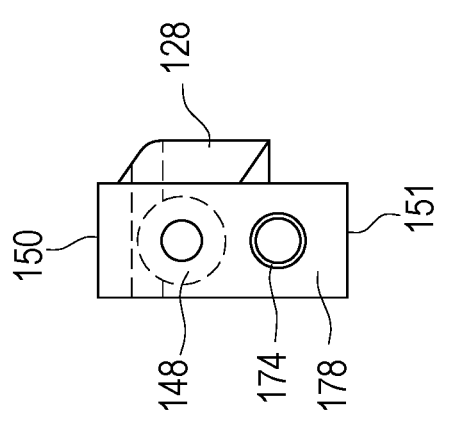
Figure 5E:
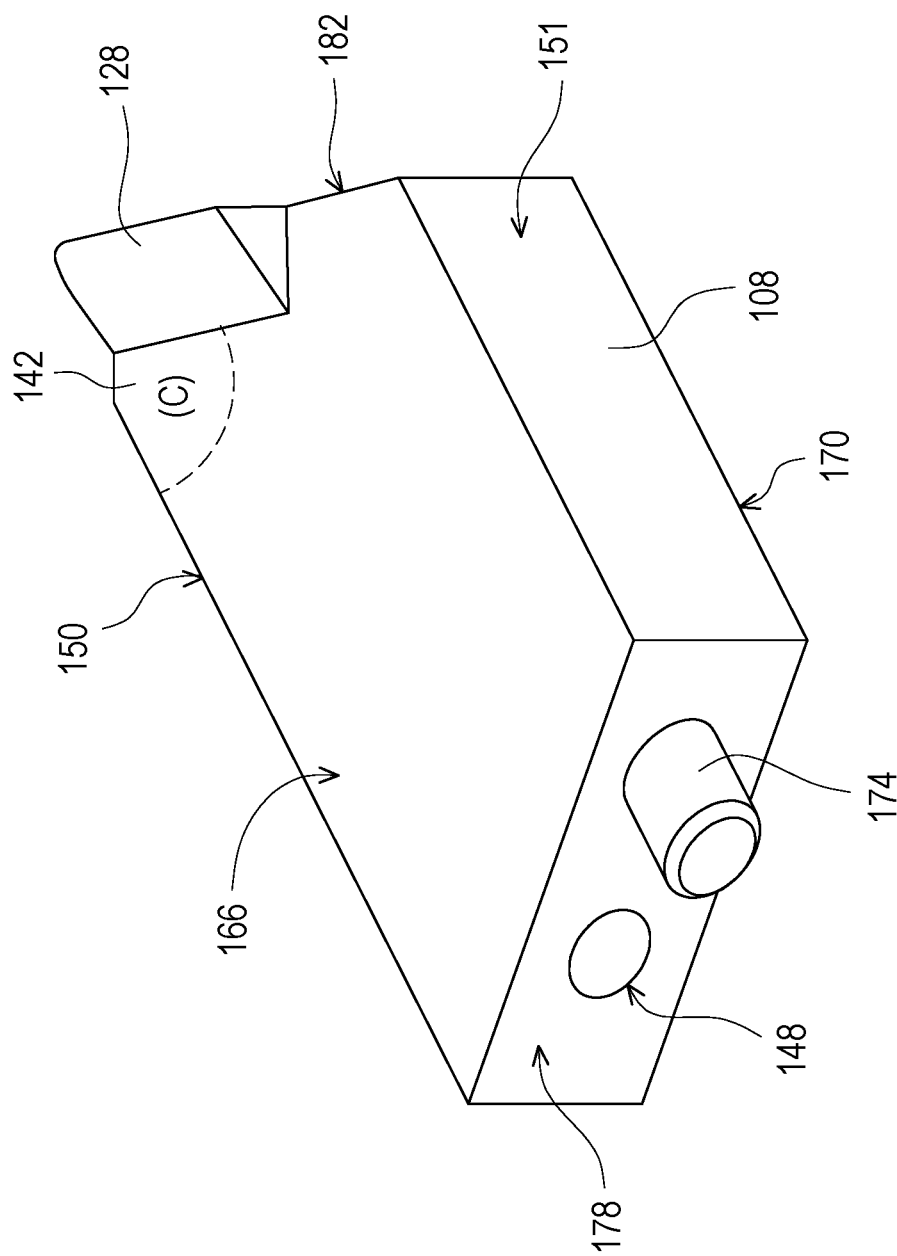
Figure 6E:
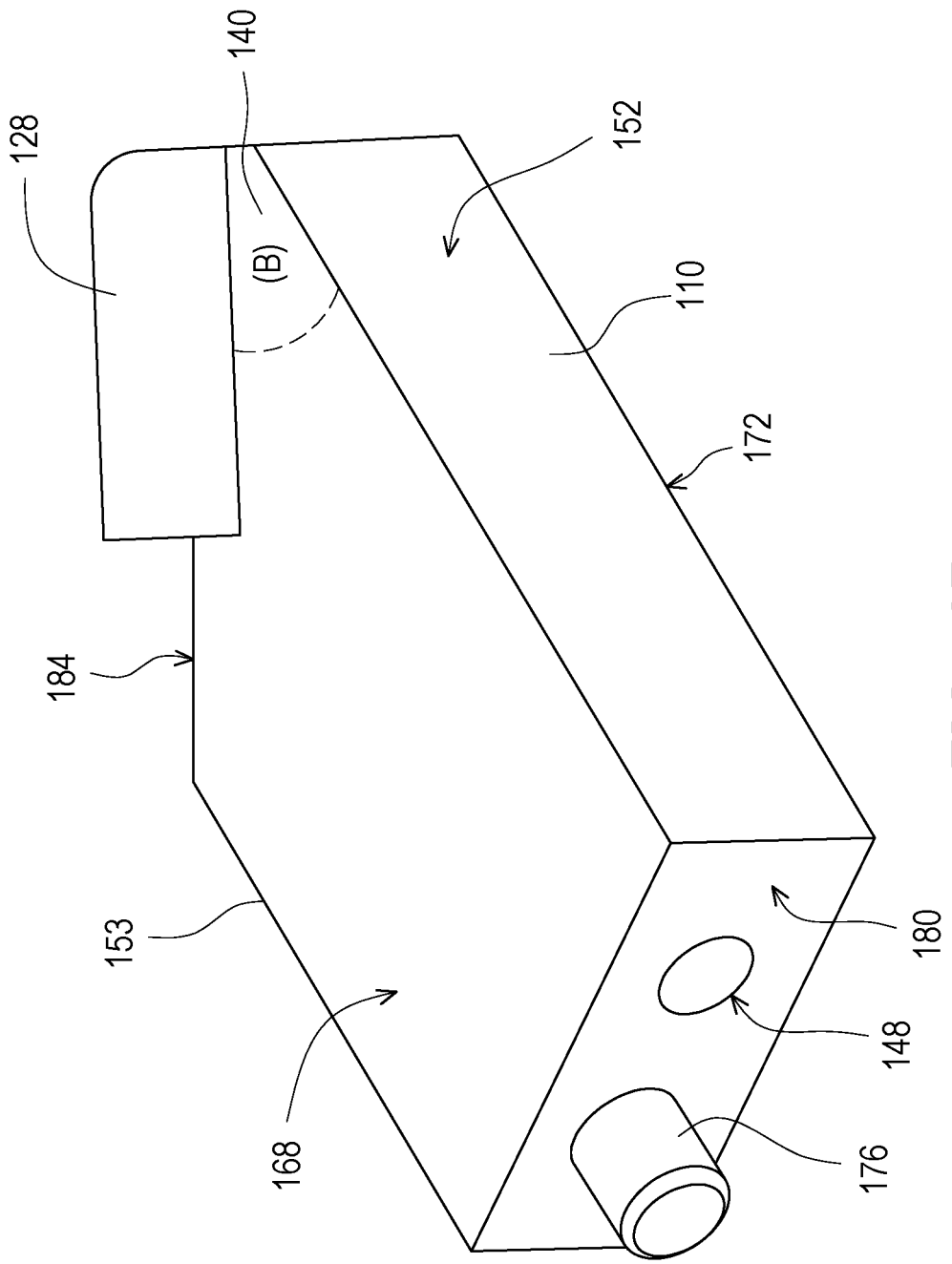

Turning now to FIG. 4, there is shown a detailed view of the storage elevator seat 106 in accordance with some embodiments. As illustrated in FIG. 4, the storage elevator seat 106 is shown prior to attachment to the first elevator sidewall 107A and the second elevator sidewall 107B. The storage elevator seat 106 includes a plurality of attachment points 154 located along a first side edge 156 (not shown) and a plurality of attachment points 154 located on a second side edge 158 of the storage elevator seat 106. In accordance with some embodiments, one or more of the attachment points 154 are suitably aligned with the attachment points 146 located on the bottom 126 of the second sidewall 107B. Similar alignment occurs between the attachment points 154 on the first side edge 156 of the storage elevator seat 106 and the attachment points 146 located on the bottom 126 of the first sidewall 107A. In some embodiments, the attachment points 154 are suitably threaded to receive a fastener (not shown) extending through the first and second sidewalls 107A-107B to secure the sidewalls 107A-107B to the storage elevator seat 106. In other embodiments, friction or other such fasteners may be used to secure the storage elevator seat 106 to the first and second sidewalls 107A-107B.

The first mirror block 108 and the second mirror block 110 are attached to a front side 160 of the storage elevator seat. Similarly, a second pair of first and second mirror blocks 108 and 110 are coupled to a back side 162 of the storage elevator seat 106, as shown in FIG. 4. In some embodiments, the storage elevator seat front side 160 and the storage elevator seat back side 162 each include one or more attachment points 154 (as described above) to which the first mirror blocks 108 and the second mirror blocks 110 join to the storage elevator seat 106. FIG. 3 provides a partial illustration of the aforementioned attachment points 154 to which the mirror blocks 108-110 are affixed. According to some embodiments, the top surface 166 of the first mirror block 108 and the top surface 168 of the second mirror block 110 are level, i.e., coplanar, with the top surface 164 of the storage elevator seat 106. In accordance with one embodiment, the bottom surface 170 of the first mirror block 108, the bottom surface 172 of the second mirror block 110, and the storage elevator seat 106 are substantially coplanar, as shown in FIG. 4. The skilled artisan will appreciate that portions of the storage elevator seat 106, as illustrated in FIG. 4, may extend past the bottom surfaces of the mirror blocks 108, 110 without affecting the functioning of the wafer position shift detection system 100.

Referring now to FIGS. 5A-5E, there are shown, respectively, top, bottom, front, back and three-dimensional views of the first mirror block 108 in accordance with one embodiment of the subject application. As illustrated in FIGS. 5A-5E, the first mirror block 108 includes a first mirror block top surface 166 that is substantially planar and to which is affixed, formed, or otherwise secured a mirror 128. The mirror 128 is positioned on the top surface 166 along a front side 182 of the first mirror block 108. The first mirror block back side 178 includes a first mirror block alignment tab 174 configured to engage a corresponding opening or attachment point 154 of the front side 160 or back side 162 of the storage elevator seat 106. In some embodiments, the first mirror block alignment tab 174 is implemented as cylindrical so as to slide into an attachment point 154 of the storage elevator seat 106. According to other embodiments, the first mirror block alignment tab 174 is suitably sized to frictionally engage the attachment point 154 of the storage elevator seat 106. The first mirror block 108 further includes a first mirror block first edge 150 and an opposing first mirror block second edge 151, each of which are perpendicular to the first mirror block back side 178.

Figure 7A:
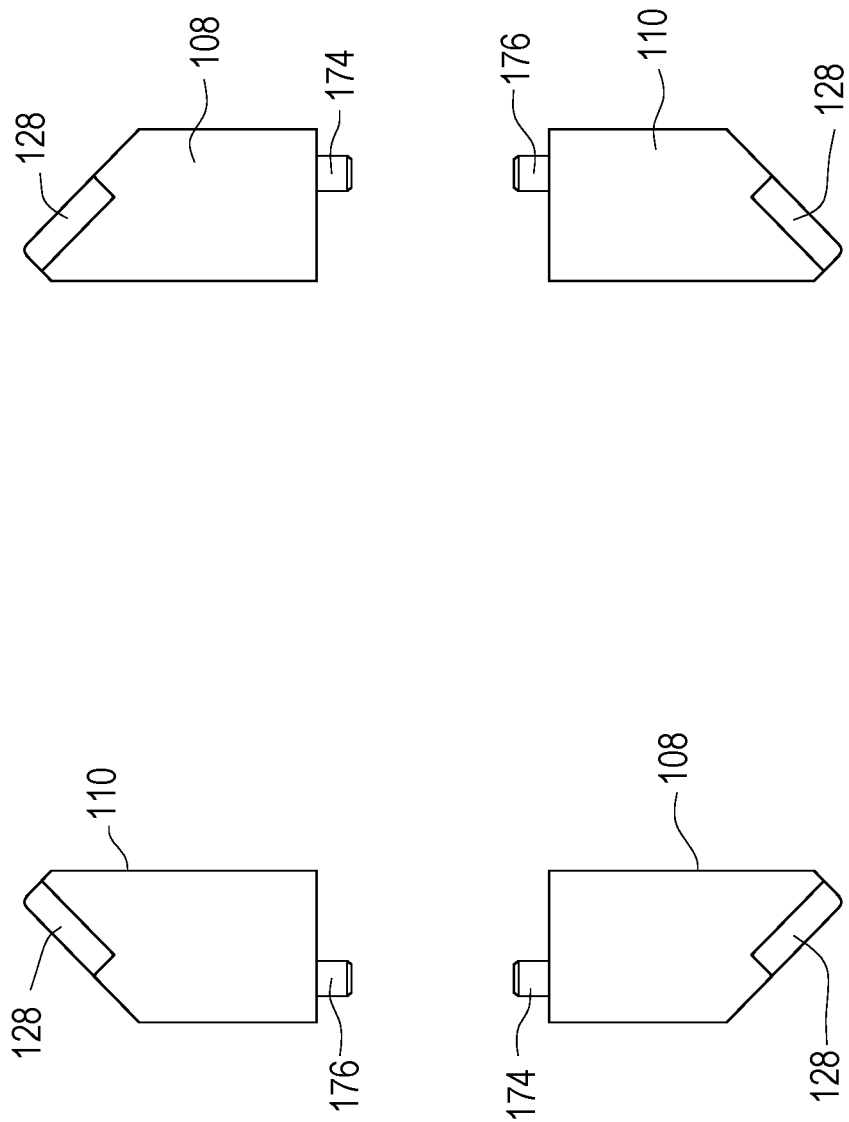
FIGS. 7A-7B are views of first and second mirror blocks in accordance with some embodiments.
Figure 7B:
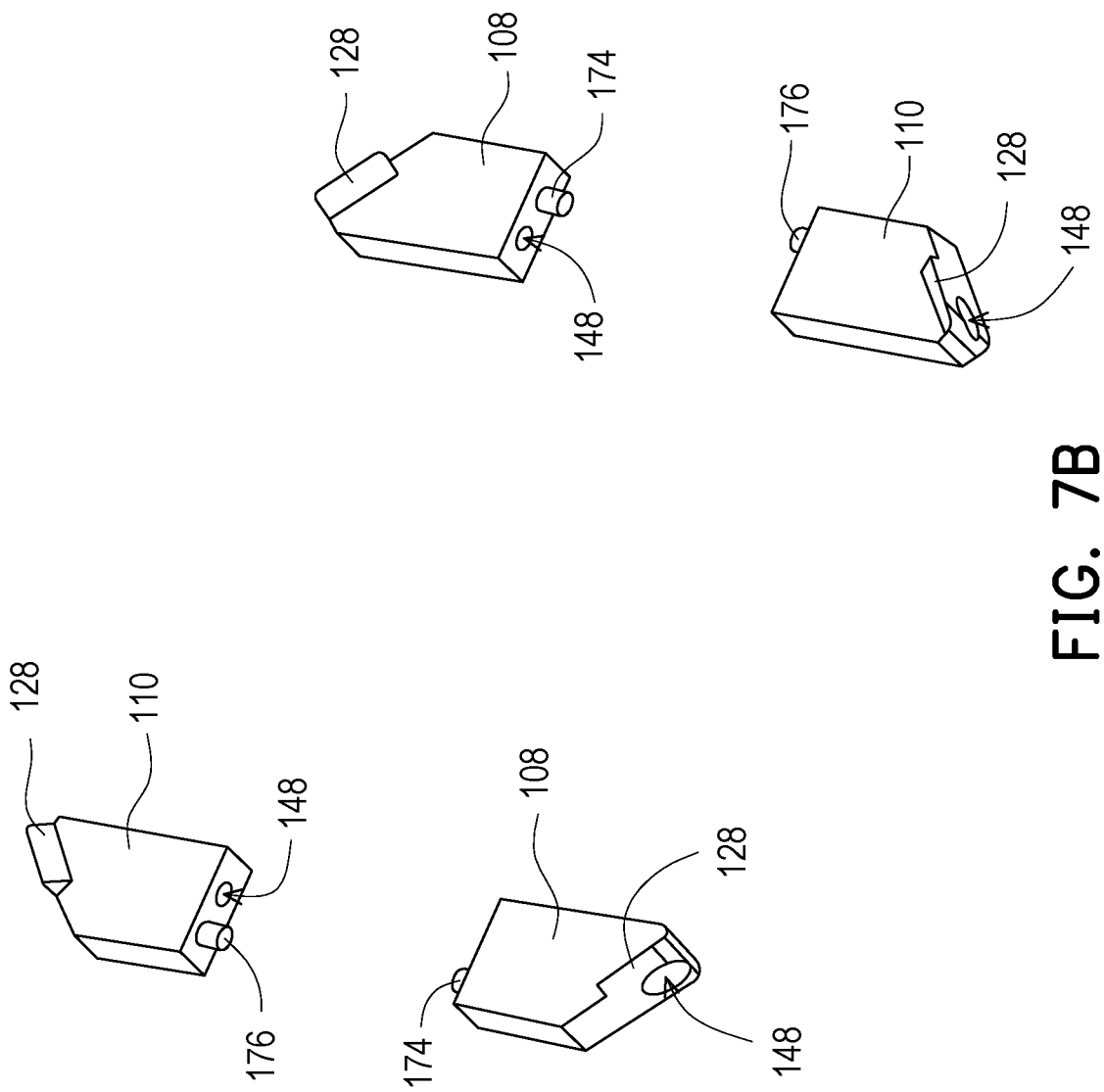

Turning now to FIGS. 6A-6E, there are shown, respectively, top, bottom, front, back and three-dimensional views of the second mirror block 110 in accordance with one embodiment of the subject application. As illustrated in FIGS. 6A-6E, the second mirror block 110 includes a second mirror block top surface 168 that is substantially planar and to which is affixed, formed, or otherwise secured a mirror 128. The mirror 128 is positioned on the top surface 168 along a front side 184 of the second mirror block 110. The second mirror block back side 180 includes a second mirror block alignment tab 176 configured to engage a corresponding opening or attachment point 154 of the front side 160 or back side 162 of the storage elevator seat 106. In some embodiments, the second mirror block alignment tab 176 is implemented as cylindrical so as to slide into an attachment point 154 of the storage elevator seat 106. According to other embodiments, the second mirror block alignment tab 176 is suitably sized to frictionally engage the attachment point 154 of the storage elevator seat 106. FIG. 7A provides a top view of the four mirror blocks 108, 110 in position without the storage elevator seat 106. FIG. 7B provides a three-dimensional view of the four mirror blocks 108, 110 in position without the storage elevator seat 106. The second mirror block 110 further includes a second mirror block first edge 152 and an opposing second mirror block second edge 153, each of which are perpendicular to the second mirror block back side 180.

Figure 8:
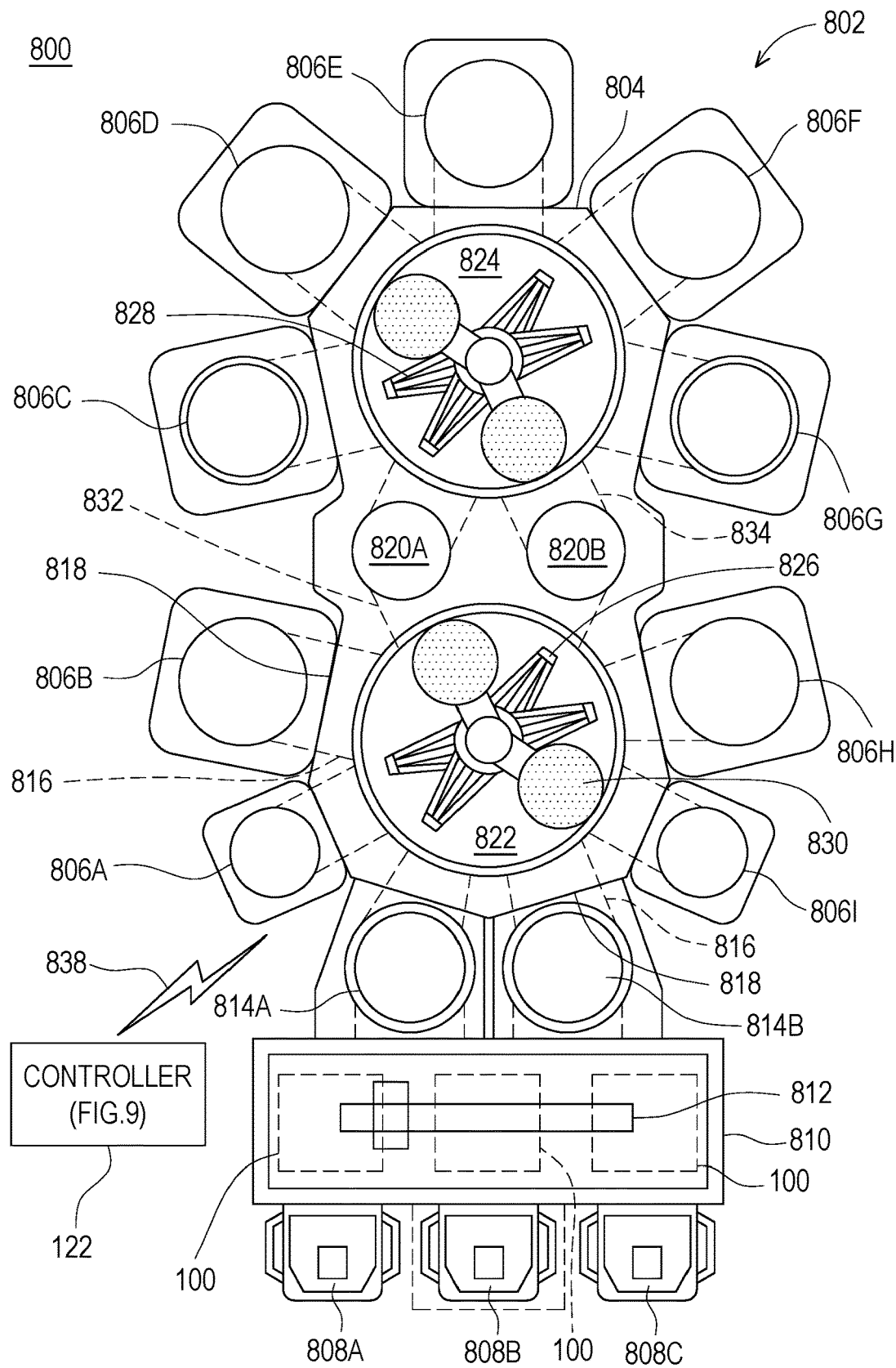
FIG. 8 is a schematic view of a multi-chamber platform utilizing the wafer storage system of FIG. 1 in accordance with some embodiments.

Turning now to FIG. 8, there is illustrated an exemplary semiconductor manufacturing system 800 utilizing the wafer storage system 100 of FIG. 1 in accordance with one embodiment disclosed herein. As shown in FIG. 8, the semiconductor manufacturing system 800 includes a platform 802 having a main body 804 and a plurality of processing chambers 806A, 806B, 806C, 806D, 806E, 806F, 806G, 806H, and 806I communicatively coupled to the main body 804 so that semiconductor wafers undergoing processing can be robotically transferred between the various processing chambers. It will be appreciated by those skilled in the art that the number and types of process chambers 806A-806I may vary in accordance with the manufacturing requirements of a particular fab.

As will be appreciated, the system 800 is capable of producing layers of various materials stacked on one another on a substrate without exposing the substrate to the pressure and contaminants of ambient air until the stack is complete. Thus, the process chambers 806A-806I may include at least one metal deposition chamber and at least one dielectric layer deposition chamber for depositing layers in a stack. In other embodiments, one or more of the process chambers 806A-806I may include a sputtering target for depositing material onto the stack.

In the embodiment illustrated in FIG. 8, the main body 804 includes a first robot buffer chamber 822 housing a first robot 826 and a second robot buffer chamber 824 housing a second robot 828. In accordance with such an embodiment, each of the first and second robots 826 and 828 may be configured to transfer a wafer/substrate 116A-116C between various process chambers 806A-806I. The main body 804 may further include a pair of intermediate processing or treatment chambers 820A and 820B, which further enable transfer of a wafer/substrate 116A-116C between the first and second robot buffer chambers 822 and 824.

According to one embodiment, the intermediate processing or treatment chamber 820A is located within a tunnel or passageway 832 connecting the first robot buffer chamber 822 to the second robot buffer chamber 824. Similarly, the intermediate processing or treatment chamber 820B is positioned within a separate passageway 834 connecting the first robot buffer chamber 822 to the second robot buffer chamber 824. In accordance with one embodiment, these separate passageways 832, 834 between the two robot buffer chambers 822, 824 permit one passageway to be used for loading and the other passageway for unloading, and vice versa, while the system 800 is being used for wafer processing.

According to some embodiments, the intermediate processing or treatment chambers 820A-820B may be configured for pre-treating of a wafer 116A-116C (e.g., remote plasma etch cleaning, heating, etc.) before processing in one or more of the process chambers 806A-806I and/or for post-treating of a wafer 116A-116C (e.g., cool-down) after treatment in one or more of the process chambers 806A-806I.

In accordance with one exemplary embodiment, the platform 802 may utilize a plurality of different process chambers 806A-806I. For example and without limitation, process chambers 806A and 806I may be implemented to perform high temperature degas annealing. In such an embodiment, process chambers 806B and 806H may be implemented as Collins or pre-clean chambers, e.g., PVD chambers. Further, process chambers 806C and 806G may be implemented as silicon-cobalt-nickel (SiCoNi) deposition chambers, whereas process chambers 806D and 806E may be implemented as high bottom coverage (HBC) titanium deposition chambers. In such an embodiment, process chamber 806F may be implemented as a chemical vapor deposition (CVD) titanium nitride (TiN) deposition chamber. The skilled artisan will appreciate that the types of chambers 806A-806I and the processes performed therein (as well as the materials deposited on the wafer 116A-116C) may be modified in accordance with the type of semiconductor device being manufactured, and the description above is intended as one possible configuration of the platform 802 in accordance with varying embodiments of the subject application.

The main body 804 further illustrates one or more load lock chambers, designated in FIG. 8 as "Load Lock A" (LLA) 814A and "Load Lock B" (LLB) 814B. In some embodiments, the two load lock chambers 814A and 814B are mounted to the first robot buffer chamber 822 and in communication with the interior of the first robot buffer chamber 822 via access ports 816 and associated gate valves 818 and to an equipment front end module (EFEM) 810 of the platform 802. The EFEM 810 includes a robot 812 that is configured to transfer wafers 116A-116C, e.g., one at a time, from a front opening unified pod (FOUP) 808A, 808B, 808C to the load lock chamber 814A or 814B of the main body 804. In accordance with one embodiment, the EFEM 810 includes one or more wafer shift detection systems 100 positioned therein to receive wafers 116A-116C from a corresponding FOUP 808A-808C.

As mentioned above, the various process chambers 806A-806I are attached around the first robot buffer chamber 822 and the second robot buffer chamber 824. In FIG. 8, each of the various process chambers 806A-806I may be adapted for various types of processing, e.g., etching, annealing, deposition, cleaning, etc. As shown in FIG. 8, access to and from the process chambers 806-806I may also be accomplished via associated access ports 816 and gate valves 818. Notably, the arrangement of the various chambers and layout of robotic transfer pathways of the system 800 of FIG. 8 is to be understood to be a nonlimiting illustrative example, and other numbers and arrangements of chambers and other robotic transfer pathway layouts are contemplated.

In some embodiments contemplated herein, the platform 802 may be operated such that each process chamber 806A-806I, robot buffer chamber 822-824, intermediate processing or treatment chamber 820A-820B, LLA 814A and LLB 814B may be isolated from each other by gate valves or the like. Accordingly, it will be appreciated that the internal atmosphere in each of these chambers may be independently controlled, both in terms of gas composition and pressure. In some embodiments, variations in pressure levels may be minimized during wafer transfer via an associated vacuum pump or pumps (not shown), which may be configured to provide a vacuum gradient across the system from the load locks LLA 814A and LLB 814B to the process chambers 806A-806I.

Operation of the platform 802 may be controlled by one or more controllers 122, shown in FIG. 8 in data communication with the platform 802 via a communications link 838. The communications link 838 illustrated in FIG. 8 may be any suitable means of wired or wireless communication, including, for example and without limitation, the public switched telephone network, a proprietary communications network, infrared, optical, or other suitable wired or wireless data communications. In some embodiments, the various components of the system 100 are in communication with a distributed computing environment, e.g., a local area network, a wireless local area network, a virtual private network, a wide area network, or the like. In some embodiments, the controller 122 may be configured to control, for example and without limitation, operations of the front end 810 including the operations of the FOUPs 808A, 808B, and 808C, the front end robot 812, operations of the main body 804 including the first and second robots 826-828, the various pumps, gas supplies, valves and treatment equipment of the main body 804, as well as operations of the process chambers 806A-806B. The functioning and controls provided by the controller 122 in accordance with the various embodiments discussed herein will be better understood in conjunction with FIG. 9, discussed in greater detail below.

In some embodiments, processing of a wafer 116A-116C may be initiated by unloading the wafer 116A-116C from one of the FOUPs 808A, 808B, 808C into the storage elevator 104 of the wafer shift detection system 100 located in the EFEM 810. One or more emission sources or lasers 112, in accordance with instructions from the controller 122, then transmit a laser beam 113 down the first elevator sidewall 107A to a mirror block 108, 110 and across to a corresponding mirror block 108, 110 for transmission (i.e., reflection) up the second elevator sidewall 107B to the one or more receive sensors 114. Upon a detection of a wafer 116B out of alignment (as illustrated in FIG. 1), the controller 122, via a speaker, display or other auditory or visual presentation component, generates an alert indicating the alignment issue. That is, upon a detection of a wafer 116B within the laser beam 113, i.e., blocking or interrupting transmission thereof to the first mirror block 108, a determination is made that wafer 116B is out of alignment. Thereafter a technician or automated component (e.g., robotic arm, etc.) returns the wafer 116B to proper alignment in the storage elevator 104. After correction, or upon a negative detection of wafer shift, the wafer 116A-116C is transferred to one of the load lock chambers 814A, 814B.

Although illustrated in FIG. 8 as utilizing FOUPs for housing wafers 116A-116C for transport to and from the system 800, it will be appreciated that other mechanisms for supporting wafers 116A-116C may be used in some embodiments, including, for example and without limitation, cassettes, racks, and the like. The skilled artisan will further appreciate that other mechanisms may be used in place of the EFEM 810 to transfer a wafer 116A-116C to the main body 804. After reduction of pressure to a suitable vacuum pressure in the load lock chamber (814A or 814B) containing the wafer 116A-116C, the wafer 116A-116C is ready for transfer to an appropriate process chamber or sequence of process chambers for processing. In accordance with one embodiment, the interior pressure of the load lock chamber 814A or 814B containing the wafer 116A-116C to be processed is at substantially the same vacuum pressure as the first robot buffer chamber 822.

Figure 9:
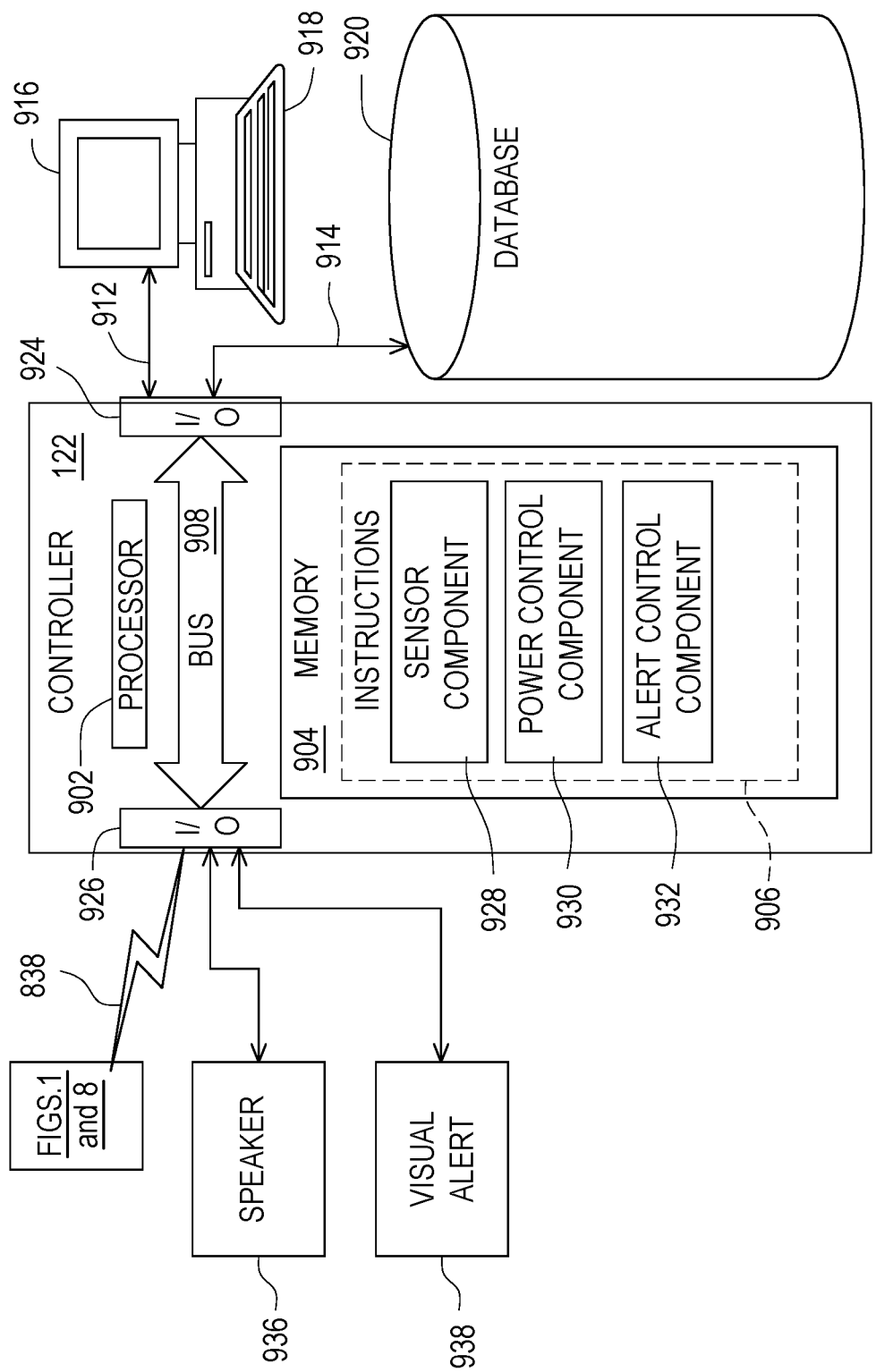
FIG. 9 illustrates a block diagram of a controller in accordance with some embodiments.

Turning now to FIG. 9, there is shown an illustrative block diagram of a suitable controller 122 associated with the wafer shift detection system 100 and the aforementioned semiconductor manufacturing system 800 in accordance with one embodiment of the subject application. The various components of the controller 122 may be connected by a data/control bus 908. The processor 902 of the controller 122 is in communication with an associated database 920 via a link 914. A suitable communications link 914 may include, for example, a switched telephone network, a wireless radio communications network, infrared, optical, or other suitable wired or wireless data communications. The database 920 is capable of implementation on components of the controller 122, e.g., stored in local memory 904, i.e., on hard drives, virtual drives, or the like, or on remote memory accessible to the controller 122.

The associated database 920 is representative of any organized collections of data (e.g., process tool information, fabrication information, wafer positioning, material information, etc.) used for one or more purposes. Implementation of the associated database 920 is capable of occurring on any mass storage device(s), for example, magnetic storage drives, a hard disk drive, optical storage devices, flash memory devices, or a suitable combination thereof. The associated database 920 may be implemented as a component of the controller 122, e.g., resident in memory 904, or the like. In one embodiment, the associated database 920 may include data corresponding to, for example and without limitation, production scheduling, wafer positioning, process chamber information (e.g., type, position, status, etc.), and the like.

The controller 122 may include one or more input/output (I/O) interface devices 924 and 926 for communicating with external devices. The I/O interface 924 may communicate, via communications link 912, with one or more of a display device 916, for displaying information, such estimated destinations, and a user input device 918, such as a keyboard or touch or writable screen, for inputting text, and/or a cursor control device, such as mouse, trackball, or the like, for communicating user input information and command selections to the processor 902. The I/O interface 926 may communicate with external devices such as the wafer shift detection system 100, the semiconductor manufacturing system 800, emission sensors 112, receive sensors 114, a speaker 936, a visual alert 938 (e.g., flashing light, screen, display, etc.), and the like, via a suitable the communications link 838.

It will be appreciated that the controller 122 illustrated in FIG. 9 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Furthermore, while depicted in FIG. 9 as a networked set of components, the controller 122 is capable of implementation on a stand-alone device adapted to interact with the wafer shift detection system 100 and the semiconductor manufacturing system 800 described herein.

The controller 122 may include one or more of a computer server, workstation, personal computer, cellular telephone, tablet computer, pager, combination thereof, or other computing device capable of executing instructions for performing the exemplary method.

According to one example embodiment, the controller 122 includes hardware, software, and/or any suitable combination thereof, configured to interact with an associated user, a networked device, networked storage, remote devices, or the like.

The memory 904 illustrated in FIG. 9 as a component of the controller 122 may represent any type of non-transitory computer readable medium such as random access memory (RAM), read only memory (ROM), magnetic disk or tape, optical disk, flash memory, or holographic memory. In one embodiment, the memory 904 comprises a combination of random access memory and read only memory. In some embodiments, the processor 902 and memory 904 may be combined in a single chip. The network interface(s) 924, 926 allow the computer to communicate with other devices via a computer network, and may comprise a modulator/demodulator (MODEM). Memory 904 may store data processed in the method as well as the instructions for performing the exemplary method.

The digital processor 902 can be variously embodied, such as by a single core processor, a dual core processor (or more generally by a multiple core processor), a digital processor and cooperating math coprocessor, a digital controller, or the like. The digital processor 902, in addition to controlling the operation of the controller 122, executes instructions 906 stored in memory 904 for performing the method set forth hereinafter.

As shown in FIG. 9, the instructions 906 stored in memory 904 may include a sensor component 928 configured to control operations of the one or more emission sources or lasers 112 and the one or more receive sensors 114. According to one embodiment, the sensor component 928 may be programmable via the controller 122 in accordance with the particular size of the wafer 116A-116C being processed, the number of lasers 112 and/or sensors 114 utilized, the angles 130 of the mirrors 128 utilized, and the like. In operation, the sensor component 928, alone or in conjunction with other components of the controller 122 may be configured to activate laser 112, and/or sensor 114, receive output (e.g., signals) from the receive sensors 114 and detect position shift of wafers 116A-116C upon entry and exit of wafers 116A-116C into the storage elevator 104. In some embodiments, monitoring of wafer position shift may occur at every wafer 116A-116C entry/exit into the storage elevator 104, upon initial loading of the storage elevator 104, or at a predetermined frequency, e.g., every 5 seconds, every 7 seconds, every 10 seconds, every 15 seconds, etc.

As illustrated in FIG. 9, the instructions 906 stored in memory 904 may also include a power control component 930 configured to supply power to the semiconductor manufacturing system 800, and particularly the various robotic arm assemblies tasked with moving wafers 116A-116C within the system 800. In some embodiments, the power control component 930 is configured to receive an output from the sensor component 928 indicating that a wafer shift has occurred in one or more storage elevators 104. Upon receipt of such signal, the power control component 930 may stop movement/processing of wafers 116A-116C in the affected storage elevator 104.

The instructions 906 stored in memory 904 may further include an alert control component 932 configured to activate and control the visual and auditory alert components, i.e., speaker 936 and visual alert 938. In some embodiments, the alert control component 932 receives an output from the sensor component 928 indicating that a wafer 116B has shifted out of alignment within a storage elevator 104. Upon receipt of such a signal, the alert control component 932 may generate an alarm or other alert sound via the speaker 936 indicating to monitoring personnel that an issue has occurred. The alert control component 932 may further be configured to generate a visual alert 938 on an associated display (916), light, flashing/spinning light assembly, etc. In accordance with some embodiments, the visual alert 938 operates in conjunction, i.e., simultaneously or sequentially, with the audible alert through the speaker 936. In another embodiment, the visual alert 938 includes a display of position, i.e., the particular storage elevator 104 in the EFEM 810 experiencing the wafer shift, and/or a particular wafer storage slot 120 in which the wafer 116B has shifted. It will be appreciated that variations on these alerts and information provided are contemplated herein.

The various components and hardware described above with respect to FIGS. 1-9 may be configured to perform and implement the methods set forth in greater detail below, e.g., the methods illustrated in the flowchart of FIG. 10.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions.

Figure 10:
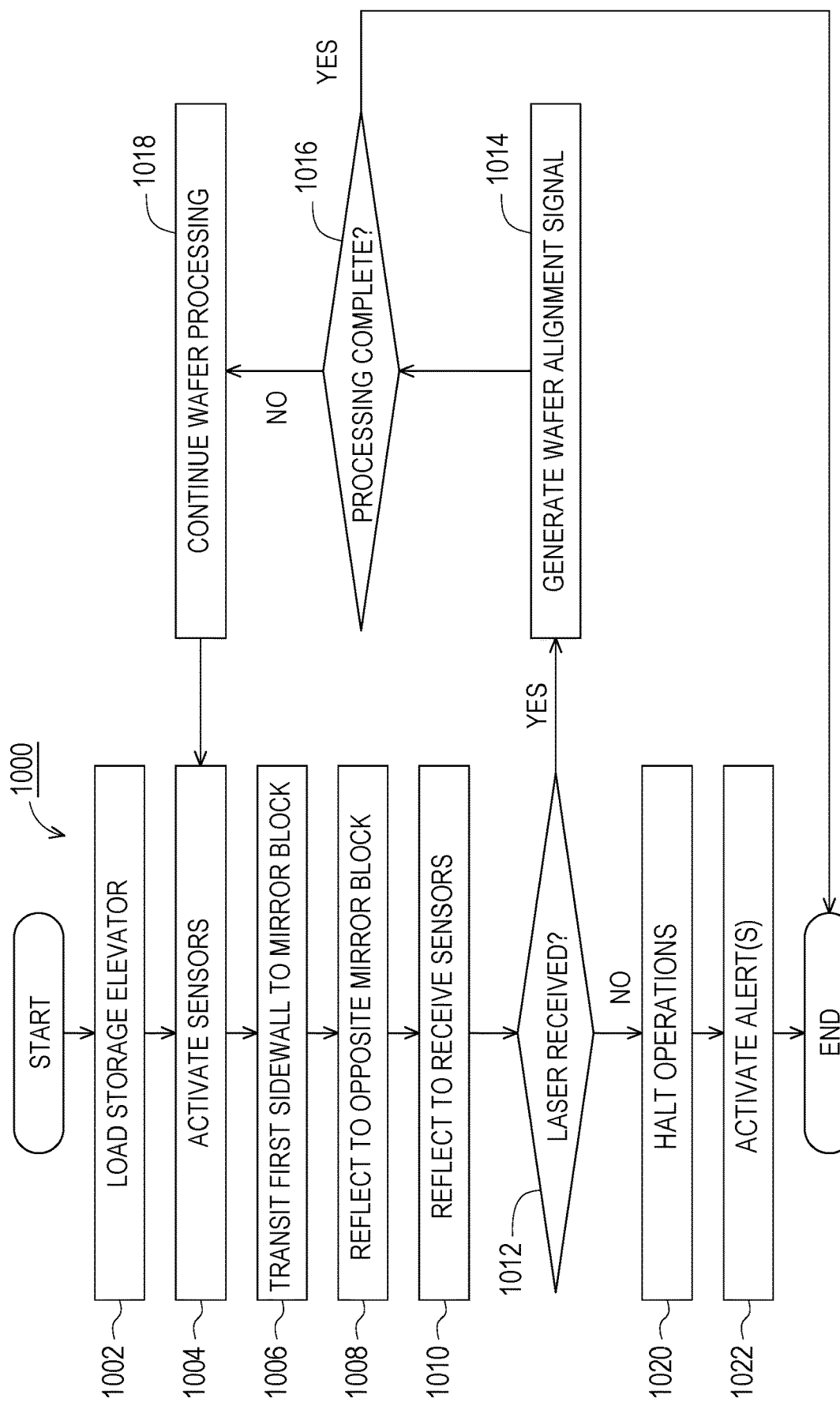
FIG. 10 illustrates a flowchart of a method for detecting wafer shift in accordance with some embodiments.

Referring now to FIG. 10, there is provided a method 1000 for detecting wafer shift within a storage elevator 104 in accordance with one embodiment. As shown in FIG. 10, the method begins at step 1002 with the loading of one or more wafers 116A-116C from a FOUP 808A-808C into the storage elevator 104 of the wafer shift detection system 100 as illustrated in FIG. 8. At step 1004, one or more emission sources or lasers 112 and corresponding one or more receive sensors 114, arranged above the storage elevator 104, are activated via the sensor component 928 or other suitable component associated with the controller 122. At step 1006, a laser beam 113 (or other suitable light emitted by the emission source 112) transits down a first storage elevator sidewall 107A to a mirror 128 of a first mirror block 108 (front of storage elevator seat 106) or to a mirror 128 of a second mirror block 110 (back of storage elevator seat 106). At step 1008, the laser beam 113 is reflected (e.g., directed) across the storage elevator seat 106 below the wafers 116A-116C to a corresponding opposite mirror block (i.e., first mirror block 108 directs to a second mirror block 110 and a second mirror block 110 directs to a first mirror block 108). At step 1010, the mirror 128 of the receiving mirror block 108, 110 reflects the laser beam 113 up the second storage elevator sidewall 107B to a corresponding one or more receive sensors 114.

A determination is then made at step 1012 whether the one or more receive sensors 114 have received the laser beam 113. Upon a positive determination at step 1012, operations proceed to step 1014 whereupon a signal is generated in accordance with an output of the receive sensor 114 indicating that a wafer alignment issue is not present in the wafer storage elevator 104. Thereafter, at step 1016, whereupon a determination is made whether processing of the wafers 116A-116C in the storage elevator 104 has completed. Upon a negative determination at step 1016, operations proceed to step 1018, whereupon operations of the semiconductor manufacturing system 800 continue. Thereafter, operations return to step 1004, whereupon the emission sensor(s) 112 emit the laser beam 113 down to the mirror blocks 108, 110 as described above. Upon a positive determination at step 1014, operations of the wafer detection system 100 terminate.

Returning to step 1012, upon a determination that one or more receive sensors 114 have not received the laser beam 113, operations proceed to step 1020. That is, transmission of the laser beam 113 from the emission sensor 112 is interrupted or blocked by a wafer 116A-116C out of alignment. Such interruption or blocking may occur between the emission sensor 112 and the first mirror block 108 or between the second mirror block 110 and the receive sensor 114, as will be appreciated. At step 1020, the sensor component 928 or other suitable component of the controller 122 signals the power control unit 930 to halt (i.e., stop) wafer processing and movement. Thereafter, at step 1022, the alert control component 932 activates the speaker 936 and/or the visual alert 938 to indicate the cessation of processing and the misalignment of one or more wafers 116A-116C within the storage elevator 104. In response to the alert, a process worker will typically inspect the elevator and visually identify the shifted wafer and move it back into position, and then restart the automated wafer processing. The restart will cause the wafer shift detection system 100 to again check for any wafer alignment issue, and if a wafer alignment issue is again detected (for example, if the worker failed to correct the problem) then the alert will again be issued. This could occur multiple times, until the signal indicates no wafer alignment issue at which point operation of the semiconductor manufacturing system will continue in accordance with the signal indicating no wafer alignment issue.

It will be appreciated that wafer shift may occur when a wafer is broken or when a positioning error occurs during robotic operations within the semiconductor manufacturing system. In the limited space of the storage elevator 104 area, diffused sensors (integrated send/receive units) may be used, however these types of sensors are inaccurate. Use of through beam sensors (i.e., separate send and receive units) using the mirror blocks described herein provide greater accuracy and detection of wafer shift. That is, the first and second mirror blocks 108 and 110 provide a mechanism by which directed (i.e., through beam) sensors may be used to accurately identify when a wafer 116A-116C has shifted out of position within the storage elevator 104. It will further be appreciated that the wafer shift detection system 100 described herein provides substantial increases in wafer shift detection via the through beam sensors, as opposed to diffused beam sensors, i.e., precise wafer position shift detection. In accordance with such usage, wafer scrap may be reduced by 500 or more pieces per year. Further, the skilled artisan will appreciate that the wafer shift detection system 100 may be implemented in any suitable semiconductor manufacturing system to reduce wafer loss and increase wafer throughput.

In accordance with a first embodiment, there is provided a method for detecting wafer shift. The method includes activating at least one laser to transmit a laser beam into an optical path that passes along a first storage elevator sidewall of a wafer storage elevator in an associated semiconductor manufacturing system to a first mirror arranged to reflect the laser beam to a second mirror arranged to reflect the laser beam along a second storage elevator sidewall to at least one receive sensor. The method further includes generating a signal, in accordance with an output of the receive sensor, indicating whether a wafer alignment issue is present in the wafer storage elevator. The method further includes continuing operation of the associated semiconductor manufacturing system in accordance with the signal indicating no wafer alignment issue.

In accordance with a second embodiment, there is provided a wafer storage elevator that includes a first storage elevator sidewall, a second storage elevator sidewall, and a storage seat positioned between the first and second storage elevator sidewalls. The wafer storage elevator further includes a first mirror block that is coupled to a front side of the storage seat, and which includes a mirror positioned on a top surface of the first mirror block. The wafer storage elevator further includes a second mirror block that is coupled to the front side of the storage seat, and which includes a mirror that is positioned on the top surface of the second mirror block. The mirror of the first mirror block is configured to reflect a laser beam from an emission sensor to the second mirror block, and the mirror of the second mirror block is configured to reflect the laser beam from the mirror of the first mirror block to a receive sensor.

In accordance with a third embodiment, there is provided a wafer shift detection system. The system includes a controller having a processor in communication with memory, one or more emission sensors, and one or more receive sensors. The sensors are in communication with the controller. The system further includes a storage elevator of an associated semiconductor manufacturing system. The storage elevator includes a first elevator sidewall having elevator wafer rails, a second elevator sidewall having elevator wafer rails positioned opposite the first elevator sidewall. The storage elevator further includes a storage elevator seat that is positioned between the bottom of the first elevator sidewall and the second elevator sidewall, a first mirror block coupled to the front side of the storage elevator seat, and a second mirror block coupled to the front side of the storage elevator seat. The memory stores instructions which are executed by the processor to send a signal from the emission sensor to the first mirror block, receive the signal at the at least one receive sensor, and determine a wafer alignment issue based upon an output of the at least one receive sensor. The memory further stores instruction to halt operations of the associated semiconductor manufacturing system in accordance with a determination of a wafer alignment issue.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for detecting wafer shift of a wafer stored within a wafer storage elevator, comprising:
   activating at least one laser at a first position to transmit a laser beam into an optical path that passes along a first storage elevator sidewall downward of the wafer storage elevator in an associated semiconductor manufacturing system to a first mirror arranged to reflect the laser beam to a second mirror arranged to reflect the laser beam along a second storage elevator sidewall upward to at least one receive sensor at a second position distinct from the first position;
   generating a signal, in accordance with an output of the receive sensor, indicating whether a wafer alignment issue is present in the wafer storage elevator; and
   continuing operation of the associated semiconductor manufacturing system in accordance with the signal indicating no wafer alignment issue;
   wherein the first mirror and the second mirror are mounted on a storage elevator seat, the storage elevator seat located between a bottom of the first storage elevator sidewall and the second storage elevator sidewall, wherein in the optical path the first mirror is arranged to reflect the laser beam along the storage elevator seat to the second mirror.

2. The method of claim 1, wherein the first mirror is angled to reflect the laser beam passing along the first storage elevator sidewall along a direction perpendicular to the first storage elevator sidewall to the second mirror.

3. The method of claim 2, wherein the first and second storage elevator sidewalls are mutually parallel and the second mirror is angled to reflect the laser beam passing along the direction perpendicular to the first storage elevator sidewall to pass along the second storage elevator sidewall to the at least one receive sensor.

4. The method of claim 1, wherein the signal indicating whether a wafer alignment issue is present in the wafer storage elevator is one of: (i) determination of a wafer alignment issue corresponding to an associated wafer stored in the wafer storage elevator interrupting the laser beam passing along at least one of the first storage elevator sidewall or the second elevator sidewall as the output of the receive sensor indicating the laser beam is not detected or (ii) determination of no wafer alignment issue corresponding to the output of the receive sensor indicating the laser beam is detected.

5. The method of claim 1, further comprising activating at least one alert in accordance with a determination of the wafer alignment issue.

6. The method of claim 5, wherein the at least one alert comprises generating an audible alert via an associated speaker in response to the signal indicating a wafer alignment issue is present in the wafer storage elevator.

7. The method of claim 5, wherein the at least one alert comprises generating a visual alert in response to the signal indicating a wafer alignment issue is present in the wafer storage elevator.

8. The method of claim 1, wherein the first storage elevator sidewall and the second elevator sidewall comprise a plurality of storage elevator rails.

9. The method of claim 8, wherein each opposing pair of storage elevator rails form a corresponding wafer storage slot having a wafer storage slot height defined between each of the plurality of storage elevator rails on the respective first and second storage elevator sidewalls.

10. The method of claim 9, wherein a height of the first mirror and a height of the second mirror are in the range of ⅓ to ½ the wafer storage slot height.

11. The method of claim 10, wherein a distance between a lower edge of the first mirror and a lower edge of the second mirror is greater than a diameter of an associated wafer stored in the wafer storage elevator.

12. A method for detecting wafer shift of a wafer stored within a wafer storage elevator, the wafer storage elevator including a first storage elevator sidewall, a second storage elevator sidewall, and a storage seat positioned between a bottom of the first and second storage elevator sidewalls, the method comprising:
   coupling a first mirror block to a front side of the storage seat, the first mirror block including a mirror positioned on a top surface of the first mirror block;
   coupling a second mirror block to the front side of the storage seat, the second mirror block including a mirror positioned on a top surface of the second mirror block; and
   using a laser beam emitted from an associated emission sensor located at a first position and aligned with the first mirror block mirror, reflecting the laser beam from the first mirror block to the second mirror block, and reflecting the laser beam from the mirror of the second mirror block to at least one receive sensor located at a second position distinct from the first position;
   wherein an optical path of the laser beam is downward along the first storage elevator sidewall, along the storage elevator seat and upward along the second storage elevator sidewall.

13. The method of claim 12, wherein the first storage elevator sidewall and the second elevator sidewall have a plurality of storage elevator wafer rails formed therein.

14. The method of claim 13, wherein each opposing pair of storage elevator wafer rails are formed to have a corresponding wafer storage slot having a wafer storage slot height defined between each of the plurality of storage elevator wafer rails on the respective first and second storage elevator sidewalls.

15. The method of claim 14, wherein a height of the mirror of the first mirror block and a height of the mirror of the second mirror block are in the range of ⅓ to ½ the wafer storage slot height.

16. The method of claim 15, wherein a distance between a lower edge of the mirror of the first mirror block and a lower edge of the mirror of the second mirror block is greater than a diameter of a wafer stored therein.

17. A method for operating a wafer shift detection system associated with a wafer stored within a wafer storage elevator, the wafer shift detection system including a controller including a processor in communication with memory, wherein the memory stores instructions which are executed by the processor to perform the method of operating the wafer shift detection system comprising:
   sending a signal from the at least one emission sensor to a first mirror block, the at least one emission sensor communicatively coupled to the controller;
   receiving the signal at least one receive sensor, the at least one receive sensor communicatively coupled to the controller;
   determining a wafer alignment issue in accordance with an output of the at least one receive sensor; and
   halting operations of an associated semiconductor manufacturing system in accordance with a determination of a wafer alignment issue,
   wherein the storage elevator is formed to include a first elevator sidewall having a plurality of elevator wafer rails, a second elevator sidewall having a plurality of elevator wafer rails positioned opposite the first elevator sidewall, a storage elevator seat positioned between a bottom of the first elevator sidewall and the second elevator sidewall, a first mirror block coupled to a front side of the storage elevator seat, and a second mirror block coupled to the front side of the storage elevator seat;
   wherein an optical path of the laser beam is downward along the first storage elevator sidewall, along the storage elevator seat and upward along the second storage elevator sidewall.

18. The method of claim 17, wherein the memory further stores instructions to:
   activate at least one of a speaker or a visual alert in accordance with a determination of the wafer alignment issue.

19. The method of claim 18, wherein each opposing pair of elevator wafer rails are formed to have a corresponding wafer storage slot having a wafer storage slot height defined between each of the plurality of elevator wafer rails on the respective first and second elevator sidewalls, and wherein a height of a mirror of the first storage block and a height of a mirror of the second mirror block are in the range of ⅓ to ½ the wafer storage slot height.

* * * * *